United States Patent

Staples

[11] 4,013,502
[45] Mar. 22, 1977

[54] STENCIL PROCESS FOR HIGH RESOLUTION PATTERN REPLICATION

[75] Inventor: Edward J. Staples, Garland, Tex.

[73] Assignee: Texas Instruments Incorporated, Dallas, Tex.

[22] Filed: June 18, 1973

[21] Appl. No.: 370,897

[52] U.S. Cl. .............................. 156/608; 156/600; 427/248 R; 427/282; 427/307; 156/656; 156/657; 156/661

[51] Int. Cl.$^2$ ........................................ C23C 13/08

[58] Field of Search ............. 156/17, 8, 7, 11, 600, 156/608; 117/35.5, 31, 93.3; 148/175; 427/282, 307, 248

[56] References Cited

UNITED STATES PATENTS

| | | |
|---|---|---|
| 3,713,922 | 1/1973 | Lepselter et al. .................. 156/17 |
| 3,718,503 | 2/1973 | Glendinning et al. ............ 117/93.3 |
| 3,737,346 | 6/1973 | Godfrey .......................... 117/93.3 |
| 3,738,881 | 6/1973 | Erdman et al. ..................... 156/17 |
| 3,839,108 | 10/1974 | Leinkram ............................ 156/11 |

Primary Examiner—Charles E. Van Horn
Assistant Examiner—Jerome W. Massie
Attorney, Agent, or Firm—Harold Levine; James T. Comfort; Gary C. Honeycutt

[57] ABSTRACT

A method and apparatus for the replication of thin film patterns. A stencil is fabricated of a material such as silicon by etching or epitaxially growing on the silicon wafer. The stencil is used as a shadow mask in molecular beam deposition of the thin film pattern. The technique provides high yields in the formation of relatively large scale thin film patterns.

3 Claims, 22 Drawing Figures

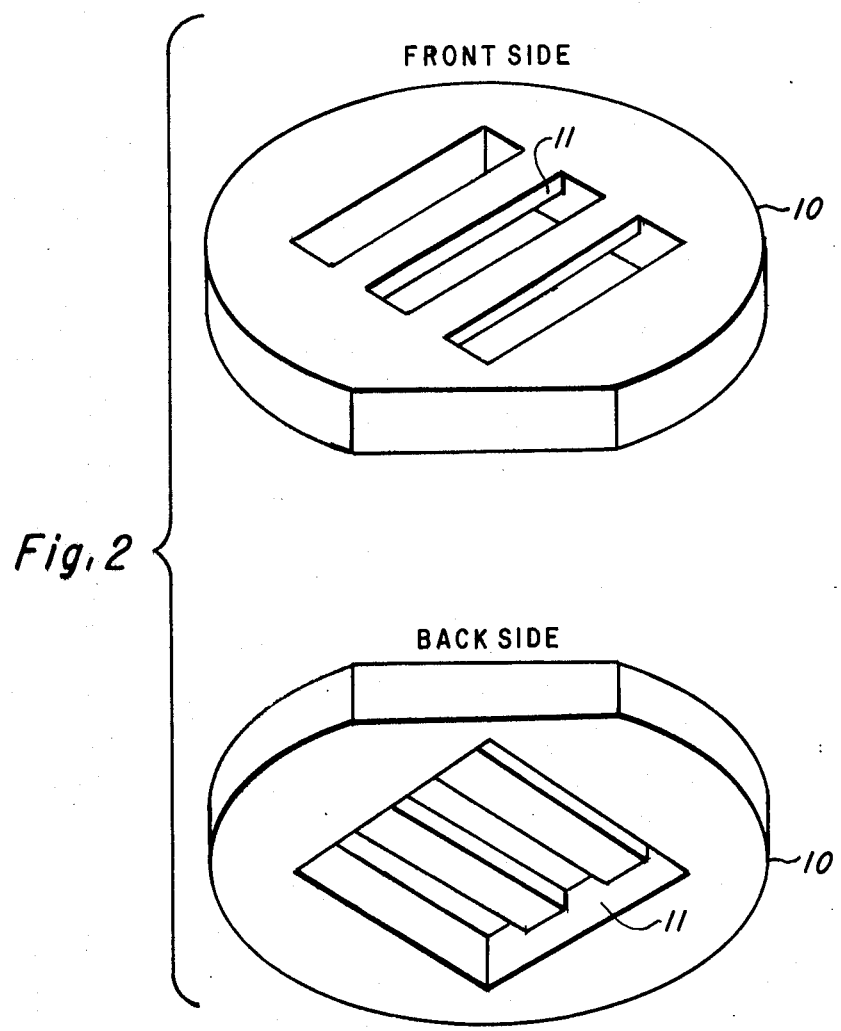

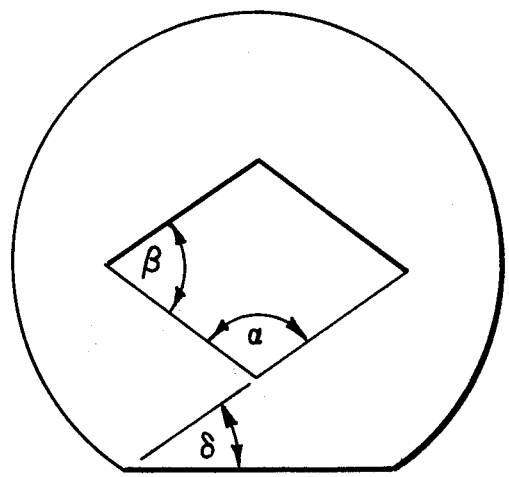
$\alpha = 109.47°$
$\beta = 70.53°$  *Fig. 3(a)*
$\gamma = 90.0°$
$\delta = 35.26°$
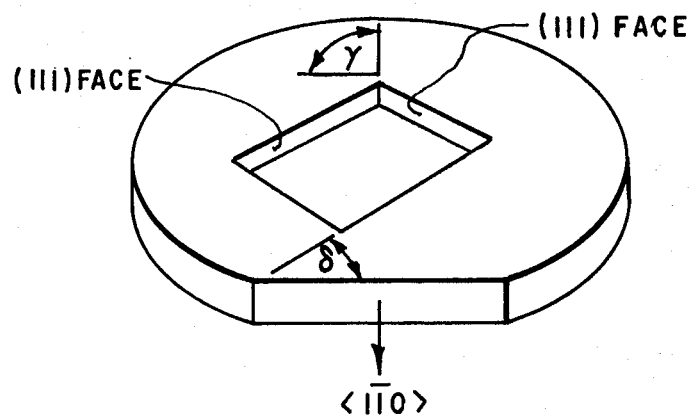
*Fig. 3(b)*
*Fig. 4*

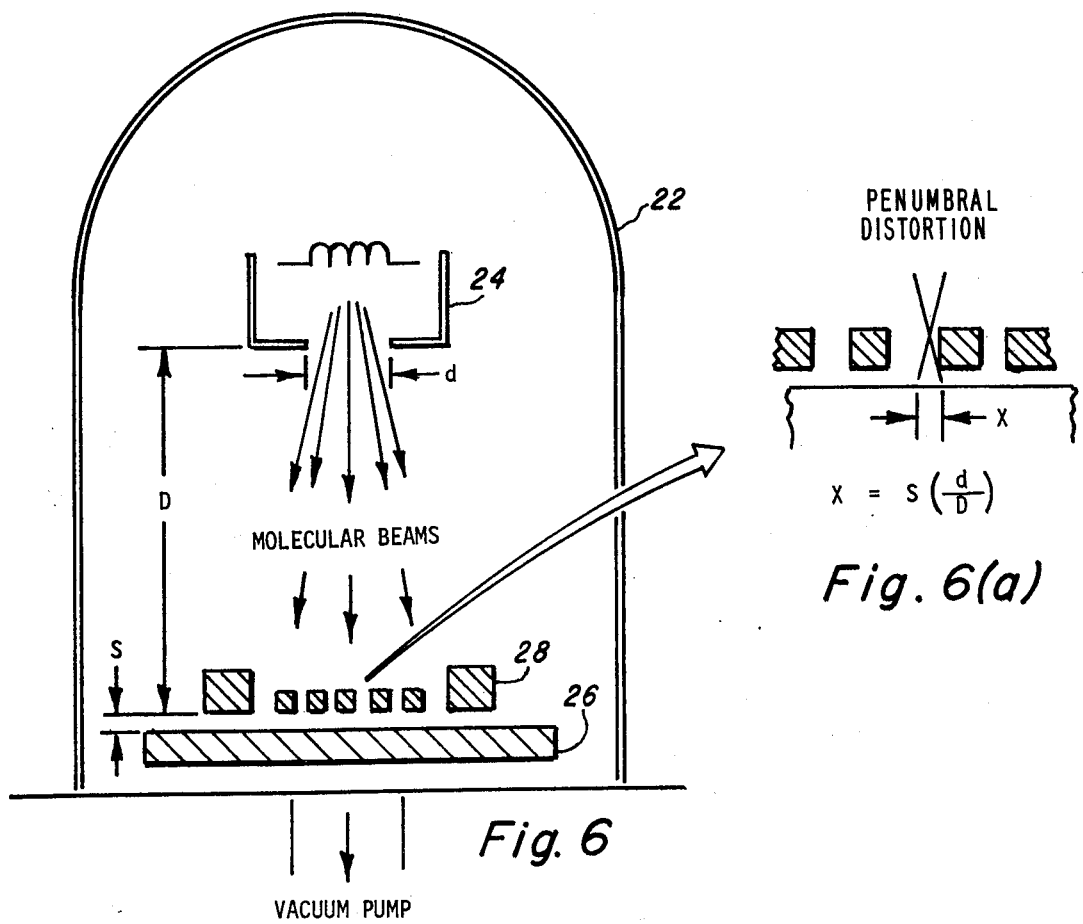
Fig. 6
Fig. 6(a)
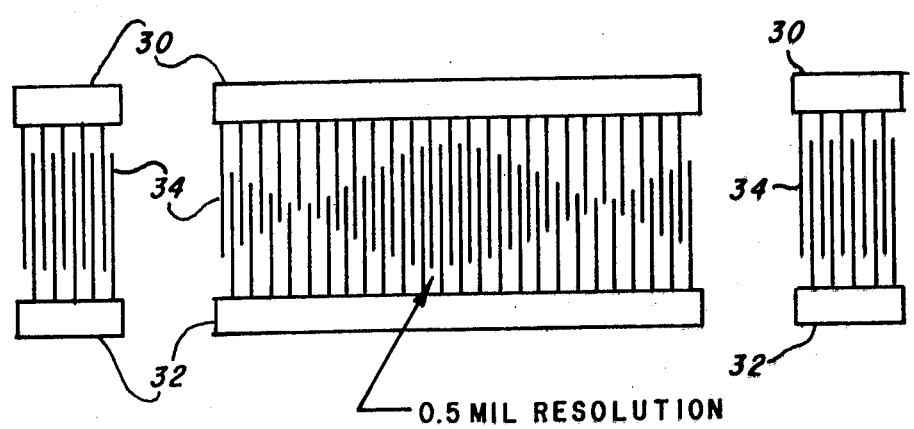
Fig. 7

STENCIL PROCESS FOR HIGH RESOLUTION PATTERN REPLICATION

This invention relates to thin film pattern replication and in particular to the preparation and use of a stencil for thin film pattern replication.

The standard technique now in use in the semiconductor industry for placing thin film patterns on substrates involves the use of photolithographic techniques. Briefly, this process involves the following major steps. The substrate is first coated with a film of the desired pattern material of the required thickness. The pattern material is then coated with a layer of photoresist, followed by exposure of the photoresist material through an appropriate photo mask. The exposed photoresist material is then developed, resulting in a surface which is selectively receptive to chemical etching. Subsequent chemical treatment of this surface results in etching away the desired portions of the photoresist material and of the pattern material thereunder. The final step of the process involves stripping away the remaining photoresist material and cleaning the completed structure. The standard process has a number of undesirable features. It is a multistep process involving the use of elaborate facilities and equipment and a substantial expenditure of labor. Furthermore, successful practice of this method requires compatibility between the film and substrate materials, the photoresist, strippers, and etchants. This may impose undesirable limitations of the types of film material and substrate material which can be used together. Also, being a chemical process, there exists the danger that the work piece will be contaminated by the photoresist or strippers.

Perhaps the most severe limitation of the standard process stems from the fact that is is extremely susceptible to the presence of dust on the film pattern material. These dust particles result in uneven distribution of the very thin layer of photoresist material which is deposited and may even cause discontinuities in this layer. As a result of this unevenness and possible discontinuities subsequent exposure of the photoresist material will be imprecise. The end result of this effect is that the pattern remaining after etching may be uneven and may have undesired breaks. In some areas of technology this limitation is not unacceptable. It is frequently the practice to form, for example, as many as 1,000 integrated circuits on one wafer of substrate material. While the dust particle effect might result in ruination of 400 of the integrated circuits there still remain 600 integrated circuits which are acceptable from a pattern replication standpoint. In the case of a large scale integration process, however, it may be possible to only form 10 integrated circuits on a wafer. In such a case, there is a high probability that many or all of the integrated circuits will be rendered useless by the presence of dust particles. This stems from the fact that as the size of the unit structure is increased, the probability of a destructive dust particle increases proportionately. Thus, the yield of large unit structures using the photolithographic process is unacceptably low. This problem is also present with other relatively large structures such as surface wave delay lines on which are deposited the interdigital transducer electrodes.

The present invention involves a new process for generating thin film, high resolution patterns on a substrate which is not subject to the objectional features discussed above. Briefly, such a process requires preparation of a stencil of a material such as silicon, selected for its amenability to the formation of a high resolution pattern mask. Portions of the stencil corresponding to the pattern which is to be deposited are selectively etched away. The use of orientationally dependent etchants insures very precise etchings of the desired pattern without undercutting. The use of a silicon stencil material along with the appropriate etchants in the manner to be described henceforth provides a strong accurately formed stencil. The stencil is then used as a mask for molecular beam deposition of the desired pattern on the substrate. Once the stencil has been prepared the actual deposition of the pattern on the substrate is a one-step process. Moreover, it is not subject to the objectional features stemming from the use of chemicals in the conventional/photolithographic process. Most importantly, once a good stencil has been prepared the process is not degraded by the presence of dust particles on the substrate to be patterned. From a pattern replication standpoint, 100 per cent yields can be achieved. Patterns extending over areas of several centimeters have been deposited using this method.

It is therefore an object of this invention to provide a thin film pattern replication method which is inexpensive in comparison with the available photolithographic process.

Another object is to provide a pattern replication method which does not involve the use of chemicals and the attendant difficulties stemming therefrom.

It is a further object to provide a thin film pattern replication process which does not inherently impose limitations on the types of materials which may be deposited.

It is still a further object to provide a pattern replication process which is impervious to the presence of dust on the substrate on which the pattern is to be formed.

It is an object to provide a pattern replication method by which multi-material pattern structures may be deposited readily. Other objects and features of the invention will be understood by consideration of the following detailed description and drawings wherein:

FIGS. 1(a)–1(i) illustrate the steps involved in the preparation of the stencil.

FIG. 2 is a front and back side view of a typical stencil pattern.

FIGS. 3(a) and 3(b) show the orientationally dependent etch properties of silicon.

FIG. 4 depicts resistivity patterns for resistivity dependent etch of the stencil.

FIGS. 5(a) and 5(b) illustrate orientationally dependent epitaxial growth of the stencil pattern.

FIGS. 6 and 6(a) a pattern replication apparatus employing stencils.

FIG. 7 is a typical surface wave filter metalization pattern.

FIGS. 8(a) and 8(b) show the steps involved in stencil replication of a surface wave filter metalization pattern.

For purposes of illustrating the preparation of the stencil, the stencil material chosen is silicon and the etchant potassium hydroxide KOH. Other stencil materials and etchants can be used as will be described later in the description.

Figure 1A:
Figure 1E:
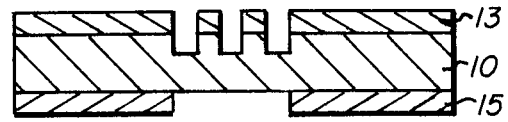
Figure 1B:
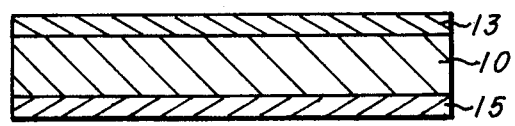
Figure 1F:
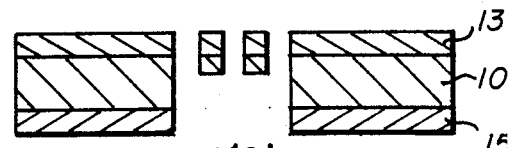
Figure 1C:
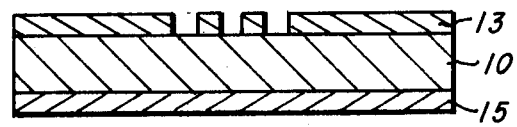
Figure 1G:
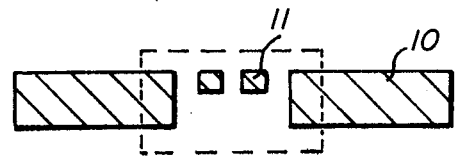
Figure 1D:
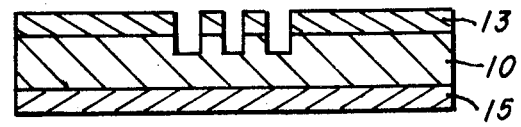
Figure 1H:
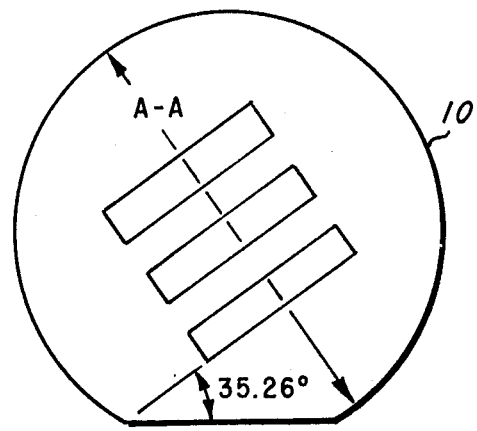
Figure 1I:
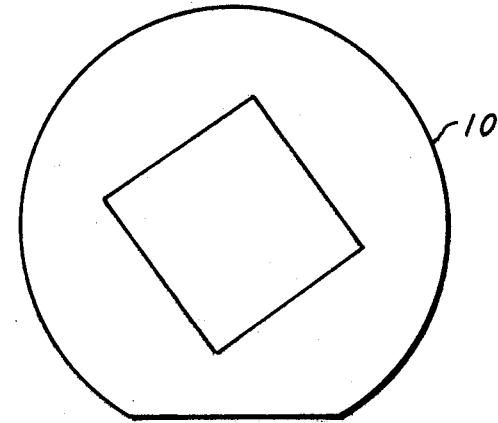

The steps involved in preparation of a stencil of this type are illustrated in FIG. 1, (FIGS. 1a–1g), the first step consisting of selecting a (110) wafer of silicon 10 with a flat in the <110> direction such as that illustrated in FIG. 1h. FIGS. 1a–1g show various cross sections of the wafer taken along cut AA of FIG. 1h. FIG. 1a shows a cross section of the wafer 10 before formation of the pattern mask area, hereafter called the membrane. Both the upper and lower surfaces of the wafer are coated with a suitable growth of silicon dioxide 13 and 15 as illustrated in FIG. 1b. As shown in FIG. 1c selected portions of the upper silicon dioxide layer 13 are removed. These removed portions correspond to the pattern openings shown in FIG. 1h. Such removal is accomplished using conventional photolithographic techniques or with an E-beam machine. As illustrated in FIG. 1h the sides of these removed portions form an angle of 35.26 degrees with the flat of the wafer 10, so as to ensure that the sides of the removed portions coincide with (111) planes of the silicon wafer 10. The wafer 10 is then etched with an orientationally dependent etchant such as KOH to a desired depth as shown in FIG. 1d. As a result of the fact that the removed portions of the upper silicon dioxide layer 13 coincides with (111) planes of the wafer 10 the portions of the wafer 10 removed by the etching process have rectangular cross sections. The next step illustrated in FIG. 1e is to remove that portion of the bottom silicon dioxide layer 15 over the entire area of the membrane. The pattern for this removal is shown in FIG. 1i. The back side of the wafer is then etched with the planar silicon etch until the wafer is etched through resulting in the cross section of FIG. 1f. The final step is to strip away all of the oxide and to clean up the stencil resulting in the cross section of FIG. 1g, with the membrane 11.

It will be noted that preparation of the stencil involves the use of conventional photolithographic techniques and is therefore subject to the damaging effects of dust particles as noted above. Thus, it may be necessary to prepare a number of stencils before a suitable copy is obtained. Once an acceptable copy is produced, however, it can be used for the deposition of a large number of patterns as will be shown later in the description. The presence of dust particles in subsequent steps is not a problem.

FIG. 2 illustrates both the front and back sides of a typical etched stencil pattern, consisting of a thin polished single crystalline silicon wafer 10. Three long narrow shallow recesses have been etched in the front side of the wafer 10. Subsequently, as illustrated in the back side view, the entire membrane area is etched away, but only to the depth of the front side etch. The result is a membrane area 11 comprised of three narrow recesses which extend completely through the wafer separated by two thin bars, each having a rectangular cross section. This membrane area 11 constitutes the stencil pattern. The use of silicon and the fact that surrounding the membrane area 11 is a region of relatively thick substrate material lends considerable strength to the stencil structure. While this particular stencil structure is less complex than others that might be contemplated, it illustrates the essential features of a typical stencil.

The orientational etching properties of KOH on silicon are depicted in FIGS. 3a and b, FIG. 3a being a plan view and FIG. 3b being a projection. A polished, single crystalline wafer of silicon is shown with the orientation such that its upper face is a (110) face while the edge flat is cut perpendicular to the <110> direction. The diamond appearing in these figures is bounded on all four sides by (111) faces. The relative orientations of the various faces involved in these figures gives rise to the circumstance that the (111) faces are perpendicular to the (110) face. Thus, as illustrated in FIG. 3b if the (110) face is considered to lie in the horizontal plane then the various (111) faces bounding the diamond all lie in the vertical plane. KOH when used as an etchant for silicon causes an etching action much more rapid in the <110> direction than in the <111> direction. To etch the wafer as illustrated in the figures, the upper (110) face of the wafer is coated with an etch resistant material everywhere but in the region defined by the diamond. When the KOH etchant is applied to the wafer there will result very rapid etching in the <110> direction but virtually no etching in the <111> directions perpendicular to the (111) faces. The result of this etching is a diamond shaped recess with the sides of the diamond defined by the (111) faces being substantially vertical. By use of an orientationally dependent etchant the traditional problem of undercutting is eliminated. This type of orientationally dependent etching is possible with various other materials including but not limited to germanium and gallium arsenide. Some semiconductor materials capable of use in this manner along with the appropriate etchants are given in Table 1.

The important feature of this novel method for stencil fabrication lies in the fact that it results in pattern elements with substantially vertical side faces. It will be seen below that use of a pattern with this characteristic permits high resolution deposition of the thin film patterns. It is considered that the use of orientationally dependent etchants is the most practical means for realizing this important feature. There exist, however, other methods for fabricating the stencil which will also result in stencil patterns with substantially vertical sides. One of these methods involves the use of resistivity dependent etchants. FIG. 4 shows a cross sectional view of a silicon wafer similar to those illustrated in FIGS. 1a–1g. In this case, the silicon wafer 12 is N-type doped silicon and is treated so as to have respective elongated doped regions 14 and 16 provided therein. The regions 14, 16 may comprise predetermined portions of the silicon wafer 12 into which has been diffused P-type dopant material. The importance of this in the present invention lies in the fact that for certain etchant materials, the resistivity of the P-type diffused area to the etching process is much less than is the resistivity of the surrounding N-type material. If the wafer 12 is exposed to appropriate resistivity dependent etchants the resultant etching action will be almost exclusively confined to the P-doped regions 14, 16. Alternatively, the regions 14, 16 may be formed in the wafer 12 as the result of a selective ion implantation process introducing a P-type dopant material into the wafer 12. Such a process also results in P-type regions 14, 16 whose resistance to the etching process is substantially less than that of the surrounding N-type silicon material. The difference between ion implantation and the diffusion of P-type dopant material is that sides more closely approximating the vertical are possible with the ion implantation process. In the practical case using eiher of these approaches, a number of long, narrow channels would be etched into the top surface of the silicon wafer 12 as defined initially by the P-type regions 14, 16. Beyond this, the fabrication of the stencil proceeds in a manner identical to that which has been discussed previously. The wafer is etched from the back side over the entire membrane area using planar silicon etch. A suitable resistivity dependent etchant for this type of application consists of an 8:3:1 mixture of acetic acid, nitric acid and hydrochloric acid. While an embodiment has been shown using N-type doped silicon stencil material with P-type regions formed therein and this specific etchant, other combinations of stencil material and etchants which permit resistivity dependent etching can be used.

Figure 5A:
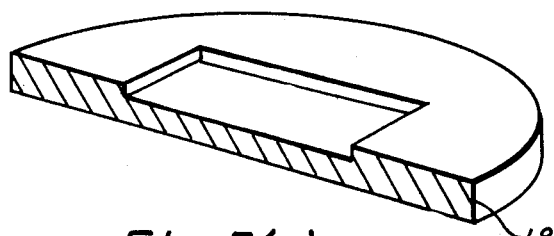
Figure 5B:
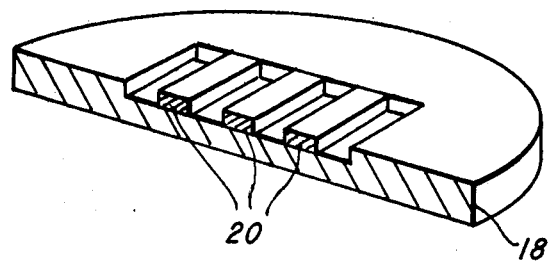

There exists yet another method for preparation of the stencil. FIG. 5a shows a cut away view of a silicon wafer 18 with the wafer oriented to have an upper (110) face. A recess has been etched into the wafer using a planar silicon etch. The mask used in performing this etch has been so oriented as to cause its sides to be parallel with (111) planes of the silicon. FIG. 5b is an intermediate stage in this method showing the same wafer 18 with a plurality of silicon bars 20 epitaxially deposited thereon. The steps involved in this epitaxial deposition process consist first of coating the entire upper surface of the silicon wafer 18 including the recessed area with a layer of silicon dioxide. This silicon dioxide layer is then selectively etched away only in the areas in which the silicon bars 20 are to be deposited. Epitaxial growth of silicon in the <110> direction is much more rapid than the growth in the <111> direction. The upper surface of the recessed area is a (110) plane while the sides of the area of the silicon dioxide layer which have been etched away have been chosen to coincide with the (111) planes of the silicon wafer 18. Consequently, the bars 20 will grow almost exclusively upward with virtually no lateral growth. This expitaxial growth is discontinued when the upper surface of the bars 20 reach the plane of the upper surface of the silicon wafer 18. The remaining portion of the previously selectively etched silicon dioxide layer is then removed from the silicon wafer 18. The resultant epitaxially grown bars 20, therefore, will have a rectangular cross section as shown in the FIG. 5(b). After deposition of the bars 20, and removal of the remaining portion of the silicon dioxide layer the lower surface of the silicon wafer 18 is etched away in the region of the membrane thereby resulting in a completed stencil. This method can be practiced with materials other than silicon. Gallium arsenide for example is another material known to be amenable to faceted epitaxial growth. Also, the specific details disclosed here for epitaxial growth of the membrane structure are not critical to the practice of this invention. The important point is that the selective growth characteristics of epitaxially grown silicon can be used to yield a membrane structure with substantially vertical sides. Variations on the specific steps of the process disclosed are also within the contemplation of the invention.

HIGH RESOLUTION PATTERN REPLICATION USING STENCILS

Thin film pattern replication employing stencils of the type discussed above can be performed over areas of several centimeters. An apparatus for this type of pattern replication is illustrated in FIG. 6. It consists first of an evacuated container 22, within which is located a molecular beam source 24. The molecular beam source is illustrated as directing molecular radiation downward. It will be understood, however, that the specific direction of this radiation is not critical to the practice of the invention. The molecular beam source is shown as having an aperture of dimension d. A typical molecular beam source might be an E-gun evaporator in which case the dimension of the aperture would be very small. Located below the molecular beam source 24 is the substrate 26 on which the thin film pattern is to be deposited. Any substrate material receptive to deposition by molecular beam radiation can be used. Located between the molecular beam source 24 and the substrate 26 is the high resolution stencil 28, the stencil being located at a distance D from the molecular beam source 24. The bottom of the stencil 28 is also shown to be separated from the upper surface of the substrate 26 by a distance S. While the stencil 28 may be placed in contact with the upper surface of the substrate 26, it may be desirable in some applications to separate the two by a short distance so as to avoid damage to the substrate surface resulting from contact with the stencil.

Operationally, molecular radiation of the material to be deposited is generated by molecular beam source 24 and directed toward the substrate 26. The stencil 28 being interposed between the source and the substrate functions as a mask to direct this radiation onto desired portions of the substrate. The mean free path of molecules in a vacuum is known to be large, typically greater than 50 centimeters. Consequently, the vast majority of molecules reaching the substrate 26 will arrive there by a direct path from the molecular beam source, and deposition will occur only on those portions of the substrate 26 which lie in direct paths from the molecular beam source 24 not interrupted by portions of the stencil 28. This results in a very defined pattern deposited on the substrate 26, subject only to a small effect as illustrated by the expanded view of FIG. 6. The surface of the substrate 26 within the region X cannot be reached by all rays flowing through the aperture of molecular beam source 24. It can be shown from elementary geometrical considerations that the width of the region X is equal to $X = SXd/D$. Since the separation S between the substrate 26 and the bottom of the stencil 28 is very small as is the aperture $d$ of the molecular beam source 24, this dimension $X$ is not only predictable, but will be very small. For purposes of clarity in the expanded view of FIG. 6, the extent of the dimension $X$ is illustrated as being significant in comparison with the distance between adjacent masking portions of the stencil 28. In reality, the extent of the area $X$ is only a very small portion of the distance between adjacent masking portions of the stencil 28 and this shadow effect is insignificant.

This type of pattern replication is almost totally insensitive to the presence of dust particles and other imperfections on the surface of substrate 26. Since the areas over which deposition occurs are related to the mean free path of molecules in the vacuum, wave length related diffractive problems normally encountered with conventional photolithographic deposition techniques are not observed using this technique. It has been observed experimentally that dust particles and other imperfections on the surface of the substrate are readily covered by the deposition material and there is no significant distortion of the boundaries of the deposited pattern.

It will be noted that as the deposition process proceeds, a certain amount of the molecular beam radiation will be deposited upon the stencil 28. Since the direction of the radiation, however, is substantially parallel to the sides of the membrane elements of the stencil 28, little buildup on these sides will occur. The sides of the membrane elements determine those areas of the substrate over which deposition will occur. A single stencil therefore, may be employed as the mask for the deposition on many substrates before cleaning of the stencil becomes necessary.

Figure 8A:
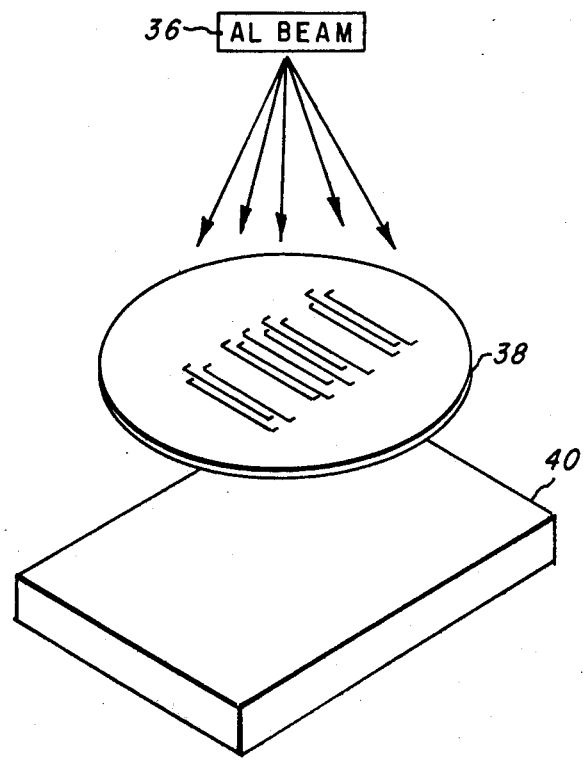
Figure 8B:
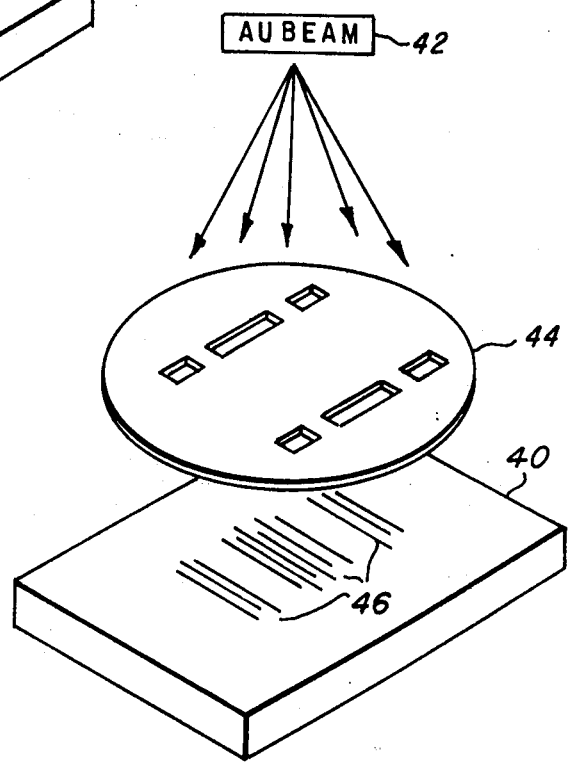

Practical applications of this method are virtually unlimited. One such practical application discussed here for illustrative purposes relates to surface wave delay line structures. Such structures typically consist of a thin substrate of piezoelectric material such as lithium niobate or quartz. Deposited on the surface thereof are interdigital transducer structures which comprise thin film patterns of aluminum or gold. A typical interdigital transducer configuration is illustrated in FIG. 7, including three interdigital transducers, each comprised of an upper conductive bar 30, a lower conductive bar 32, and interdigital fingers 34. While a stencil to reproduce the pattern of FIG. 7 in one step might conceivably be fabricated, the structure is fairly complex from a mechanical standpoint and the resultant stencil would probably be too weak for practical usage. As a result, practical reproduction of such a pattern can more readily be accomplished using a two-step process. This two-step process is illustrated diagramatically in FIGS. 8a and 8b. In FIG. 8a is shown a substrate 40 and a stencil 38 in which has been etched only the pattern of the interdigital fingers 34 of FIG. 7. The molecular beam source 36 in this case produces a beam of aluminum molecules. The substrate 40 with the interdigital fingers 46 deposited thereon is shown in FIG. 8b. A second stencil 44 contains etched windows corresponding to the upper conductor pads 30 and lower conductor pads 32 of FIG. 7. The molecular beam source 42 for the deposition of the conductive pads produces a beam of gold molecules. It is seen that the use of a multi-step deposition process possesses several advantages. It permits deposition of patterns which could not practically be accomplished with a single stencil. Secondly, different materials can be used for various parts of the pattern structure. Finally, the thickness of certain portions of the pattern can be controlled independently of the thickness of other portions of the pattern. Obviously, the multi-step approach is not limited to the two-step example used here for purposes of illustration.

DIRECT HIGH RESOLUTION THIN FILM WRITING

Figure 9:
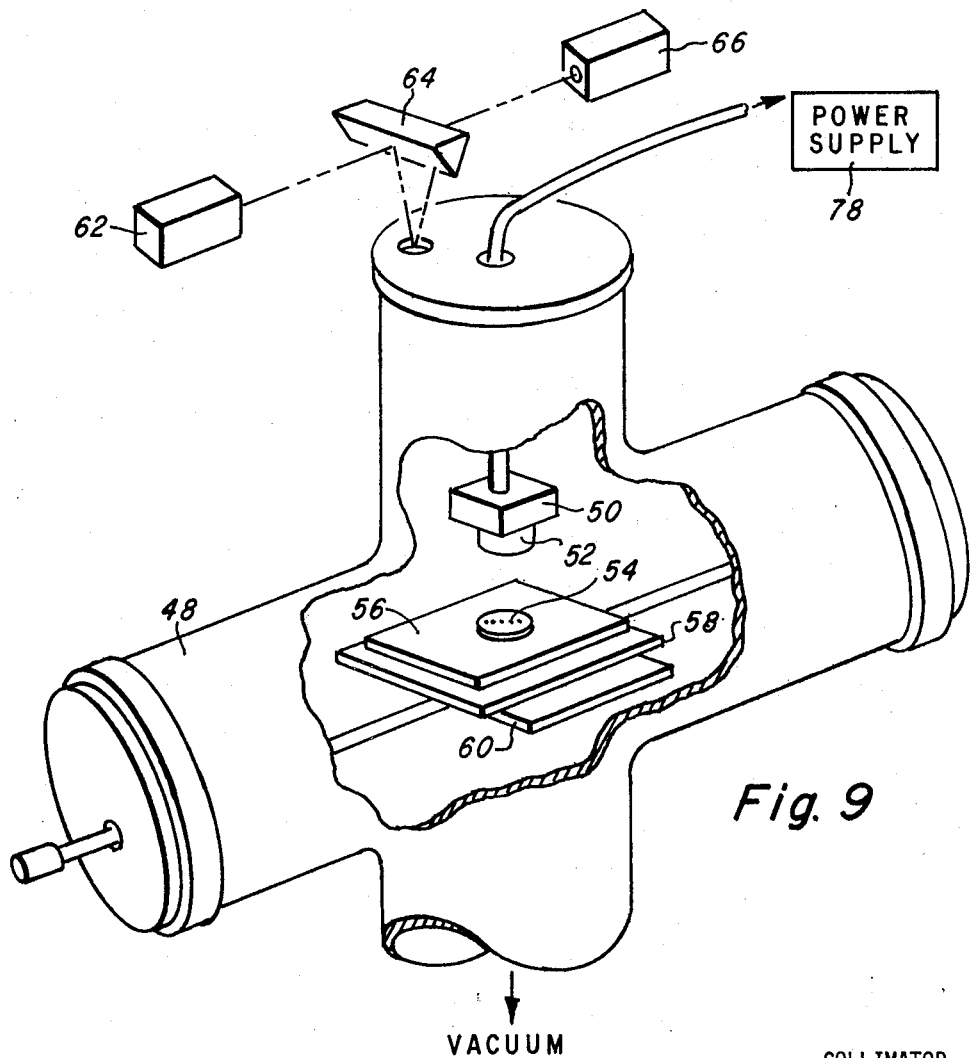
FIG. 9 depicts a high resolution thin film writing apparatus.

A significant amount of time in the development of devices which contain thin film patterns is spent on prototype designs. Traditionally, the procedure has been to generate prototype photomasks either by peel code or gerber photoplotter reductions. These processes are time consuming, expensive, and must be repeated as often as necessary for optimization of each prototype design. The availability of high resolution stencils as reticules enables high resolution thin film writing directly from glad tapes in a manner closely analogous to the gerber photoplotter. Shown in FIG. 9 is a sketch of a typical system that consists of an evacuated enclosure 48, within which is located the substrate 56 upon which the thin film pattern is to be deposited. The substrate 56 is under the locational control of an X axis translator 58 and a Y axis translator 60. Supported above the substrate 56 is the stencil or reticule 54. In this case, the opening in the reticule 54 may typically be one of many basic building block shapes, i.e., dot, line or a pattern. Located above the reticule 54 is a molecular beam source 50 which may typically be an E beam device. Radiation from the molecular beam source 50 is under the control of collimator and shutter 52, the molecular beam source 50 being energized by an external power supply 78. Precise alignment of the substrate 56 may be provided by an interferometer arrangement consisting of a laser 62, a prism 64 and a detector 66.

Figure 10:
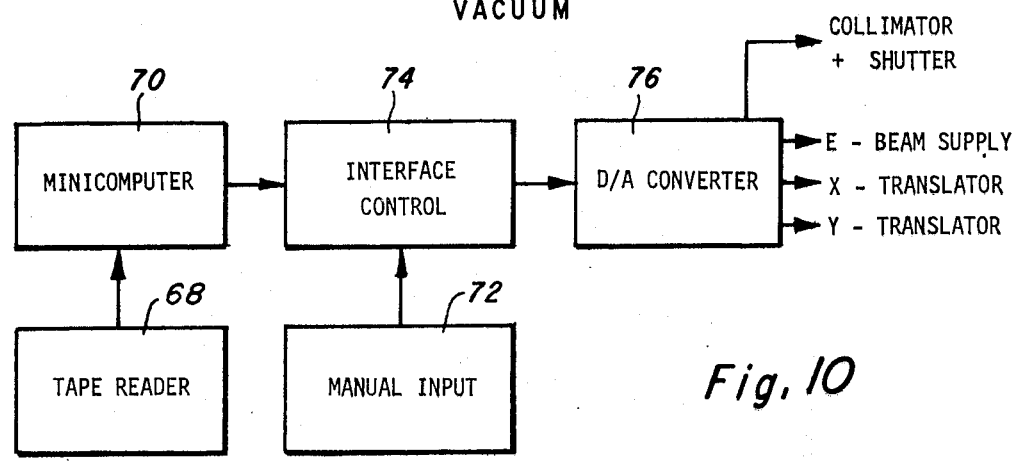
FIG. 10 is a block diagram of a control system for regulating the operation of the apparatus shown in FIG. 9.

Operationally, a prototype pattern is constructed as follows. The interferometer alignment means is used to precisely locate the substrate 56 so as to place a desired area for deposition below the basic building block aperture of the reticule 54. The molecular beam source 50 is energized and the shutter 52 opened to deposite a film having the basic building block shape on the substrate 56. The substrate 56 is then moved a short distance to permit a next deposition which adds to the original deposition. Repetition of this process permits construction of the desired thin film pattern from repeated depositions of the basic building block pattern. As illustrated by the block diagram of FIG. 10, the process may be under either tape or manual control. The controller comprises a tape reader 68 which provides digital input signals to mini computer 70. The minicomputer 70 in turn provides signals to interface control 74 which is also receptive to controls from manual input 72. Control signals developed by interface control 74 are provided to digital to analog converter 76 whose analog output control both the X and Y translators 58 and 60, the E beam power supply 78 and the collimator and shutter 52. The provision for simultaneous tape and manual input control provides the system with a great deal of flexibility. For example, it is possible to include provisions for electrically testing the device as fabrication proceeds. A basic structure might be fabricated under tape control. Electrical testing of the basic structure may indicate desirable modifications thereto. Such modifications may readily be added to the basic structure under manual input control. Thus, the system permits simulatenous fabrication and optimization of the total device. Such prototype development would traditionally involve multiple repetition of the expensive and time consuming photolithographic process. The system disclosed herein will be advantageous for any low volume function now being performed by high volume and expensive techniques.

The new method disclosed for the fabrication of high resolution stencil patterns permits the economic deposition of large area thin film patterns.

What is claimed is:
1. A method for replication of a patterned thin film on a substrate comprising:
preparing a wafer of single crystalline semiconductor material so as to locate the upper and lower surfaces of said wafer in planes parallel to a fast etching crystallographic plane of the single crystalline semiconductor material of which said wafer is formed, forming respective first and second mask layers on said upper and lower surfaces of said wafer, selectively patterning said first and second mask to remove at least one portion thereof exposing a selected area of the upper surface of said wafer wherein at least one edge of the removed portion of said first mask lies in a slow etching crystallographic plane of the single crystalline material of said wafer which is perpendicular to said upper surface of said wafer, etching the selected area of said upper surface of said wafer exposed through the selective patterning of said first mask with an orientation dependent etchant to provide at least one recess formed in the upper surface of said wafer, selectively removing a portion of said second mask in underlying alignment with said at least one etched recess in said upper surface of said wafer to expose a portion of said lower surface of said wafer in underlying registration with said at least one etched recess formed in the upper surface of said wafer, etching the exposed portion of said lower surface of said wafer up to the depth of said at least one recess formed in the upper surface of said wafer to define said membrane area of stencil material opaque to molecular beam radiation but of reduced thickness relative to the remainder of said wafer and having at least one patterned opening extending therethrough coinciding with the location of said at least one recess, removing the remaining portions of said first and second masks from said wafer whereby there is formed a high resolution stencil from a wafer of single crystalline semiconductor material so as to include a membrane area of stencil material opaque to molecular beam radiation but of reduced thickness relative to the remainder of said stencil and having at least one patterned opening therein, wherein the boundaries between each said opening and the membrane area of stencil material defining the periphery thereof lie substantially in planes perpendicular to the face of said high resolution stencil, and depositing a patterned thin film on a substrate with a molecular beam of the material to form the thin film by interposing said high resolution stencil as a deposition mask between the substrate and the source of the molecular beam and directing the molecular beam onto the membrane area of said stencil such that the molecular beam passes through said at least one patterned opening to the portion of the substrate exposed therebeneath.

2. A method as set forth in claim 1, wherein the single crystalline semiconductor material of the wafer from which the high resolution stencil is fabricated is taken from the group consisting of silicon, germanium, gallium arsenide, gallium antimonide, indium arsenide, indium antimonide, and indium phosphide.

3. A method for replication of a patterned thin film on a substrate comprising:

preparing a wafer of single crystalline semiconductor material so as to locate its upper and lower surfaces in planes parallel to a fast etching crystallographic plane of the single crystalline semiconductor material of said wafer, etching the upper surface of said wafer with an orientation dependent etchant to form a recess therein bounded by vertical side walls lying in planes respectively perpendicular to the upper surface of said wafer, forming a mask layer covering the upper surface of said wafer including the recessed area thereof, patterning said mask layer by selectively removing portions therefrom to expose at least one portion of the bottom surface of said recess formed in said wafer while another portion of the bottom surface of said recess remains covered by the patterned mask layer, epitaxially growing the same semiconductor material as that of said wafer on the said exposed at least one portion of the bottom surface of said recess until the level of said epitaxial growth is substantially flush with the upper surface of said wafer, removing the patterned mask layer from said wafer, etching the lower surface of said wafer in a region in registration with the recess formed in the upper surface of said wafer up to the depth of said recess to provide at least one patterned opening extending through said wafer in a membrane area defined by the epitaxial growth of said semiconductor material and a reduced thickness as compared to the remainder of said wafer, thereby defining a high resolution stencil having said at least one patterned opening through said membrane area, wherein the boundaries between each said opening and the membrane area of said stencil defining the periphery thereof lie substantially in planes perpendicular to the upper and lower surface of said stencil, interposing said high resolution stencil between a molecular beam source of film-forming material and a substrate on which the patterned thin film is to be deposited wherein said high resolution stencil serves as a deposition mask, and directing a molecular beam from the source onto the membrane area of said stencil such that the molecular beam passes through said at least one patterned opening to the portion of the substrate exposed therebeneath for depositing the patterned thin film thereon.

* * * * *